United States Patent [19]
Austin et al.

[11] Patent Number: 6,057,719
[45] Date of Patent: May 2, 2000

[54] PROGRAMMABLE, SELF-RESETTING DIVIDER

[75] Inventors: John S. Austin, Winooski; Ram Kelkar, South Burlington, both of Vt.

[73] Assignee: International Business Machines Corporation, Armonk, N.Y.

[21] Appl. No.: 09/092,412

[22] Filed: Jun. 5, 1998

[51] Int. Cl.[7] .................................................. H03B 19/00
[52] U.S. Cl. .............................. 327/117; 377/52; 377/107
[58] Field of Search ................................... 327/117, 118, 327/198; 377/52, 107

[56] References Cited

U.S. PATENT DOCUMENTS

| | | | |
|---|---|---|---|
| Re. 35,254 | 5/1996 | Chaisemartin et al. | 377/47 |
| 4,951,303 | 8/1990 | Larson | 377/110 |
| 5,111,488 | 5/1992 | Chaisemartin et al. | 377/47 |
| 5,373,542 | 12/1994 | Sunouchi | 377/44 |
| 5,454,018 | 9/1995 | Hopkins | 377/28 |
| 5,491,442 | 2/1996 | Mirov et al. | 327/295 |
| 5,646,564 | 7/1997 | Erickson et al. | 327/158 |
| 5,748,949 | 5/1998 | Johnston | 395/557 |
| 5,835,551 | 11/1998 | Kawarazaki | 377/20 |
| 5,867,409 | 2/1999 | Nozuyama | 364/717.03 |
| 5,872,794 | 2/1999 | Cook et al. | 371/22.4 |

*Primary Examiner*—Jeffrey Zweizig
*Attorney, Agent, or Firm*—Schmeiser, Olsen & Watts; Eugene I. Shkurko

[57] ABSTRACT

A programmable, self-resetting divider includes a modified Linear Feedback Shift Register (LFSR) counter that starts in an initial state and increments through a count range. The self-resetting divider also includes a reset circuit that detects a pre-selected final state of the modified LFSR counter, provides an output signal in response to the detecting of the final state, and provides a reset signal to the modified LFSR counter in response to the detecting of the final state.

20 Claims, 4 Drawing Sheets

PROGRAMMABLE, SELF-RESETTING DIVIDER

BACKGROUND OF THE INVENTION

1. Technical Field

The invention relates generally to integrated circuits, and more specifically, to programmable dividers for integrated circuits.

2. Background Art

In Phase-Locked Loop (PLL) circuits and similar circuits used for frequency-synthesis applications, divider circuits are used to divide the input signals to achieve a desired output frequency. In order to provide a divider circuit, a binary counter is traditionally used to implement the divide ratio of the divider. Examples of dividers using binary counters are disclosed in the following U.S. Patents: U.S. Pat. No. 4,951,303, issued in August 1990; U.S. Pat. No. 5,111,488, issued in May 1992; U.S. Pat. No. 5,646,564, issued in July 1997; and U.S. Pat. No. 5,491,442, issued in February 1996. Although binary counters effectively divide the input clocks in the aforementioned patents, binary counters may require a relatively large amount of space, especially for a wide range of divide options. Furthermore, increasing the range of desired output frequencies for a conventional divider circuit could substantially increase the amount of space for the divider circuit, depending upon the divide ratio bits used for the binary counter.

SUMMARY OF THE INVENTION

It is thus an advantage of the present invention to provide a programmable, self-resetting divider for an integrated circuit such as a phase-locked loop circuit that eliminates the above described defects.

The advantages of the invention are realized by a divider having a modified Linear Feedback Shift Register (LFSR) counter that starts in an initial state and increments through a count range. The divider also includes a reset circuit that detects a pre-selected final state of the modified LFSR counter, provides an output signal in response to the detecting of the final state, and provides a reset signal to the modified LFSR counter in response to the detecting of the final state.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
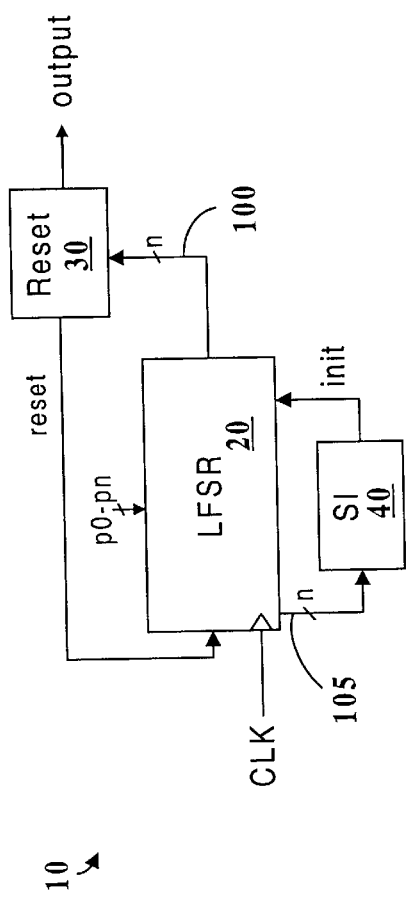
FIG. 1 is a block diagram of a programmable divider in accordance with a preferred embodiment of the present invention.

Referring to FIG. 1, a block diagram of a programmable, self-resetting divider 10 in accordance with a preferred embodiment of the present invention is shown. Divider 10 includes a modified Linear Feedback Shift Register (LFSR) counter 20, a self-initialization (SI) circuit 40, and reset circuit 30. An input clock pulse (CLK) and programmable inputs p0-pn are inputted into modified LFSR counter 20. Modified LFSR counter 20 starts in one of a plurality of states, determined by programmable input bits p0-pn, and increments through a count range. The programmable input bits are easily programmable through a user since the divide ratio may be programmable asynchronously, that is the programmable input bits may be applied anytime during the operation of the circuit, including the count cycle of the modified LFSR counter 20 or the clock cycle of the input clock pulse (CLK), without causing a glitch in the present divide ratio or allowing intermediate divide ratio modes before the start of the subsequent divide ration. Also, although the programmable inputs may be user selected, software programs may be used to select appropriate inputs. Reset circuit 30 detects a pre-selected final state of the modified LFSR counter 20 through line 100 and provides an output signal in response to the detection of the final state. Reset circuit 30 also provides a reset signal to modified LFSR counter 20 in response to the detection of the final state. Self-initialization circuit 40 detects an inoperative initial state of modified LFSR counter 20 through line 105 and provides a signal to the modified LFSR counter 20 to shift the counter 20 into an operative initial state in response to detecting the inoperative initial state.

A modified LFSR counter 20 is used for the present invention instead of a traditional counter because the programmable divider of the present invention does not need its counter to count in binary order. Consequently, the modified LFSR counter is more compact and uses less space than the traditional counter. Furthermore, as will be discussed in subsequent figures, the programmable divider in accordance with the present invention is capable of working at a wide range of divide ratios (i.e., between 1 and $2^n-1$, n equaling the number of latches used in the modified LFSR counter).

Figure 2:
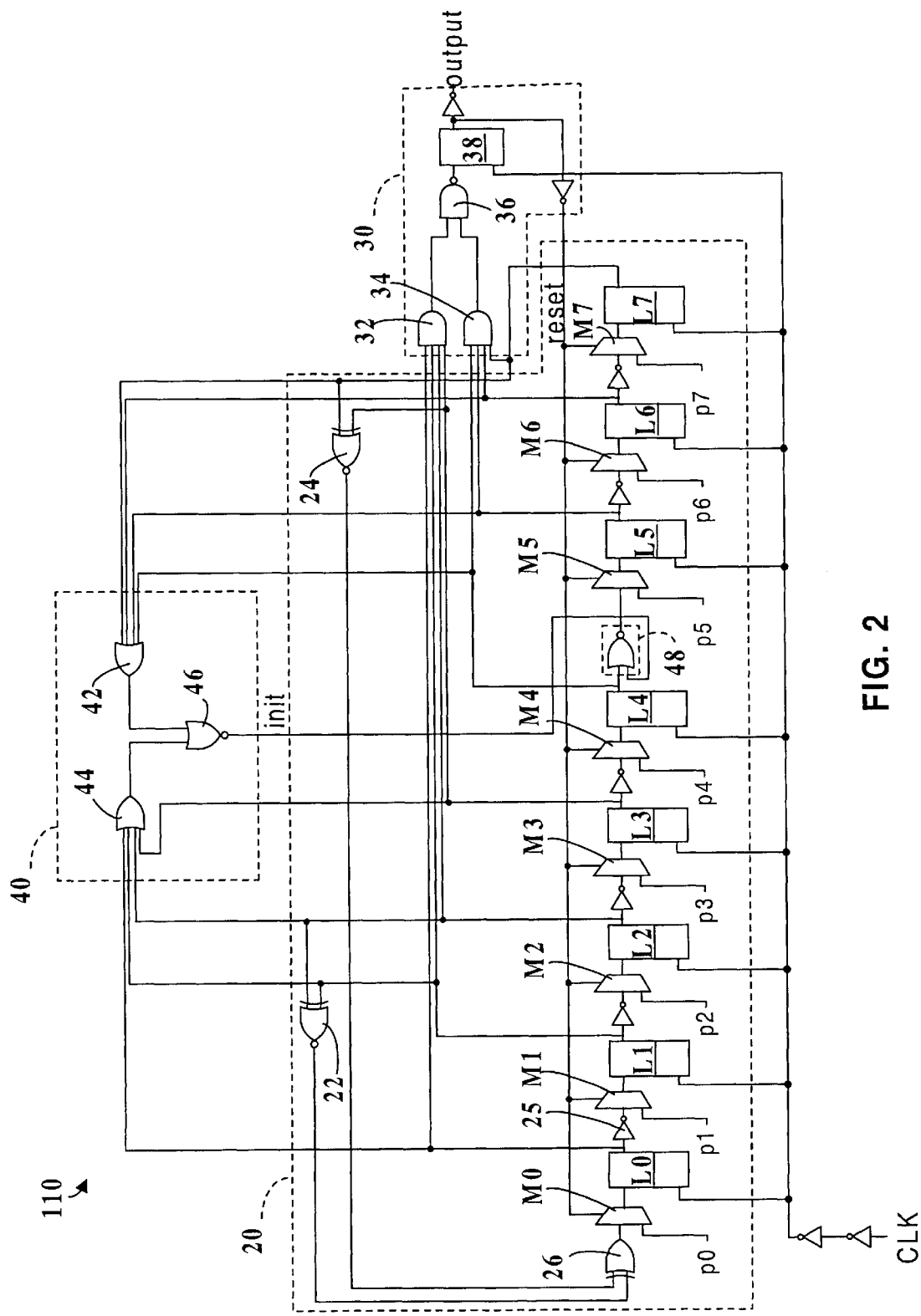
FIG. 2 is an exemplary circuit diagram of the block diagram of FIG. 1.

Referring to FIG. 2, an exemplary circuit diagram for a programmable divider in accordance with the present invention is shown. The divider circuit 110 of FIG. 2 comprises modified LFSR counter 20, reset circuit 30 and self-initialization circuit 40 and provides a divide ratio in the range of 3 to 256. In this example, modified LFSR counter 20 comprises eight latches L0–L7, eight MUX elements M0–M7 and inverters before each MUX element except for M5, which has an NOR gate 48 providing the input for M5. The inverters are used in the shift register path since the MUX elements provide an inverted output. Modified LFSR counter 20 also comprises XNOR gates 22 and 24 and XOR gate 26 in the feedback path. The outputs of L1 and L2 are applied to XNOR gate 22, and the outputs of L3 and L7 are applied to XNOR gate 24. The outputs of XNOR gates 22 and 24 are then applied as inputs of XOR gate 26. Although specific elements are used for this and other examples, such as latches, MUX elements, inverters, XOR gates, etc., it is to be understood that other elements of similar functionality may also be used.

The input clock CLK, which is delayed through two inverters, is applied at the clock inputs of L0–L7. The inverted outputs of L0–L6 are applied to the first inputs of M1–M7, respectively. The output of XOR gate 26 is applied to the first input of M0. Programmable input bits p0–p7, which may be user-programmable, are applied to the second inputs of M0–M7, respectively. The outputs of M0–M7 are then determined by the reset signal from reset circuit 30. Although eight programmable input bits, latches, MUX elements, and XOR gates are used specifically for this example, it is to be understood that any other appropriate amount of elements may be used for modified LFSR counter 20 (as will be seen in reference to FIG. 4).

Reset circuit 30 comprises AND gates 32 and 34, NAND gate 36, and latch 38, with inverters being provided after latch 38. The outputs of L0–L7 are inputted into AND gates 32 and 34. The outputs of AND gates 32 and 34 are then inputted into NAND gate 36. Latch 38 receives the output of NAND gate 36, and the input clock CLK. In this example, the inverted output of latch 38 is the circuits output, and also the reset signal for modified LFSR counter 20. As aforementioned, the reset signal is applied to the select pin of each MUX, M0–M7.

Self-initialization circuit 40 comprises OR gates 42, 44 and NOR gate 46. OR gates 42 and 44 receive the outputs from L0–L7. The outputs from OR gates 42 and 44 are then inputted into NOR gate 46, which outputs a signal INIT that is used by NOR gate 48 to shift LFSR counter 20 into an operative initial state.

In operation, modified LFSR counter 20 is loaded with a programmable initial state, determined by programmable input bits p0–p7. Each clock pulse shifts the input bits to the right, with the input to M0 being the XOR of the outputs from the second, third, fourth, and eighth latches. When modified LFSR counter 20 reaches the pre-selected final state, in this case the all-1 state (i.e., all the outputs of L0–L7 are 1), the latches are reset with the initial state.

Specifically, when modified LFSR counter 20 is not at the pre-selected final state, the modified LFSR counter 20 will go through its cycle with each clock pulse shifting the programmable bits to the right. The outputs of AND gates 32 and 34 will be LO. The output to latch 38 will be HI, which results in both the divider output and the reset line to be LO. When modified LFSR counter 20 reaches the pre-selected final state, then, and only then, will the outputs of AND gates 32 and 34 be HI, which in turn causes the output to latch 38 to be LO and the divider output and the reset line to be HI. Since the HI reset line forces the select bits of M0–M7 HI, the programmable input bits p0–p7 are selected by M0–M7 at the next clock pulse to be reloaded into the latches L0–L7. Resetting the latches with the initial state then pulls the outputs of AND gates 32 and 34 LO, which in turn causes the divider output and reset line to be LO. Thus, the divider output is HI for the duration of one clock pulse, but the interval between successive pulses of the output is controlled by the initial state.

For any LFSR counter, an inoperative initial state is to be avoided since the LFSR will not cycle through its states. In this case, the inoperative initial state is the all-0 state (i.e., when latches L0–L7 have 0 at their outputs). When the power is first supplied to modified LFSR counter 20, modified LFSR counter 20 may be in the all-0 state. Thus, self-initializing circuit 40 is provided and through the use of OR gates 42 and 44, latch outputs L0–L7 may be examined. If the inoperative initial state is detected, a signal INIT is provided to modified LFSR counter 20 through NOR gate 48, which shifts a 1 into the shift register path, thus shifting LFSR counter 20 to an operative initial state. The present invention is thus self-resetting and provides stability and usability since the user may input any value for the programmable input bits.

Figure 3:
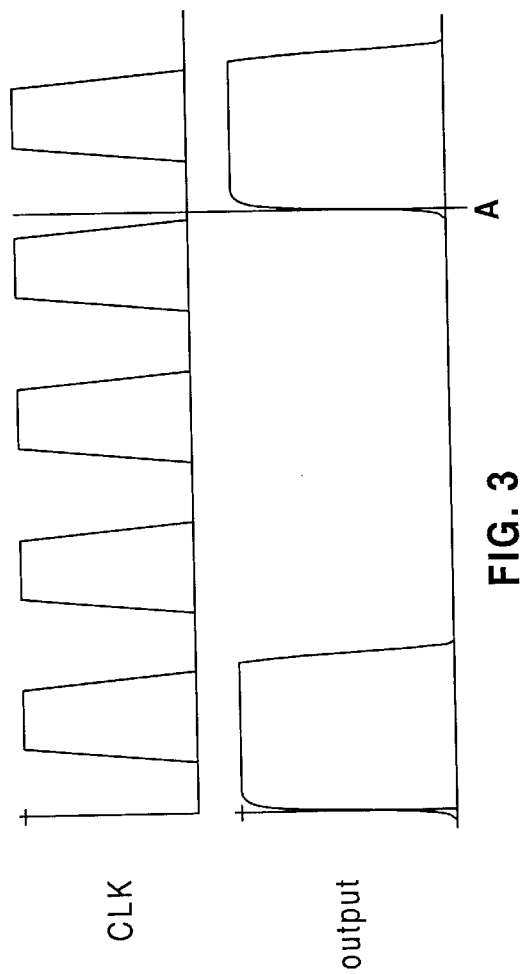
FIG. 3 illustrates a graph of the clock cycle and output for FIG. 1.

FIG. 3 illustrates the clock cycle CLK and output of the divider 10 when the divider is programmed to divide by 4. As can be seen, the output is HI for the duration of one pulse width (plus delay) of the input CLK. Also, the interval A between successive output pulses is substantially equal to four input pulses. In this example, the output of the divider is asymmetrical, thus the duty cycle at the output is not fifty percent. Also, the output's falling edge is delayed from the corresponding input clock falling edge. This delay may be removed by ANDing the output and the input clock, which results in the falling edges to be exactly M*T nanoseconds (ns) apart (wherein M is the desired divide ratio and T is the period of the input clock). The falling edges may then be selected for applications such as Phase-locked loop (PLL) applications with digital edge-detector types of Phase Detectors, by setting the value of the divider ratio M.

Figure 4:
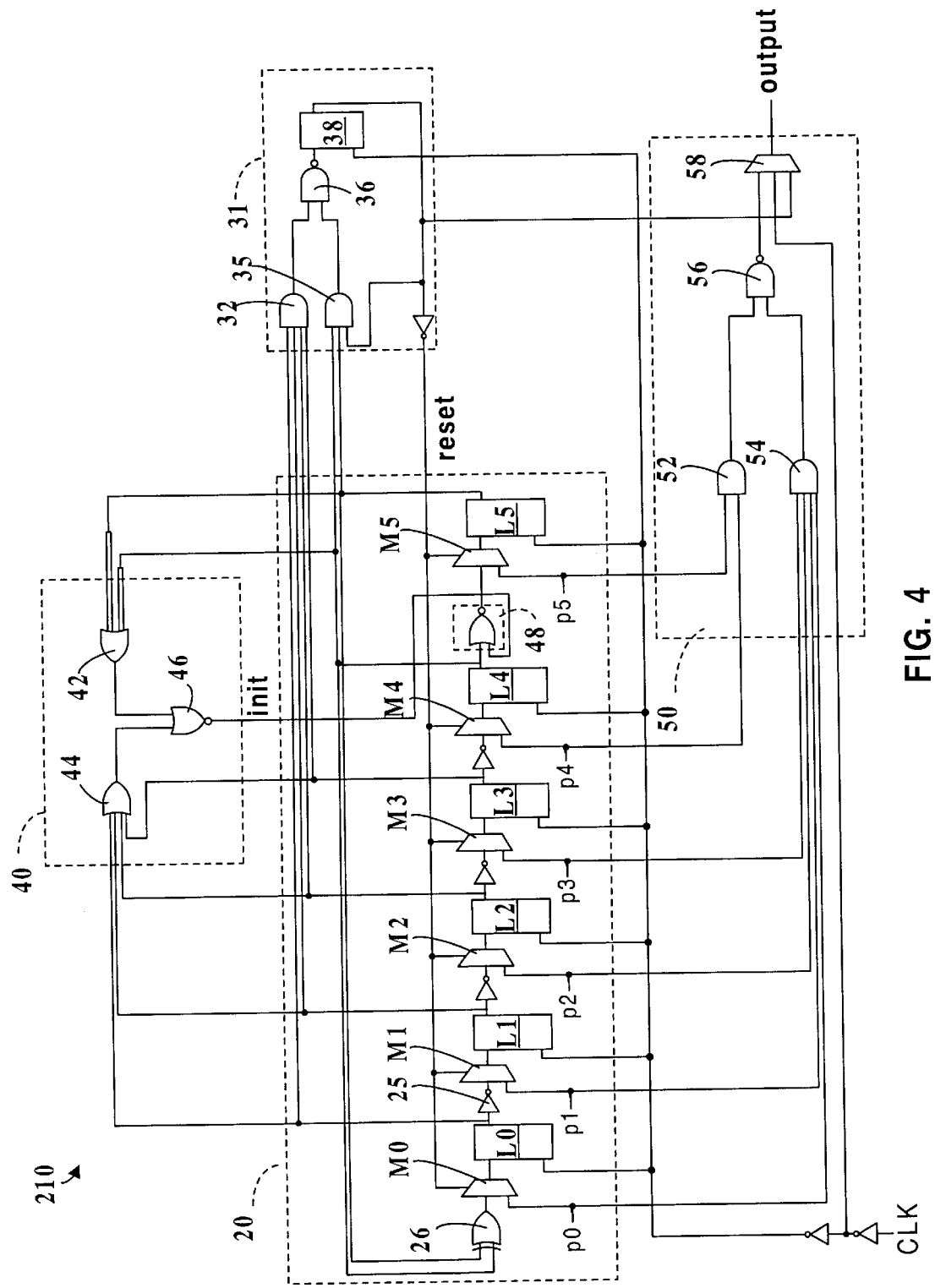
FIG. 4 is an exemplary circuit diagram of a programmable divider in accordance with a second embodiment of the present invention.

FIG. 4 illustrates a second embodiment 210 of the programmable divider 10 of the present invention. In this example, divider 210 has a range of 1 to 64 for the divide ratio. Thus, only six latches L0–L5, six MUX elements M0–M5 and corresponding inverters are needed for the shift register path of modified LFSR counter 20. Also, only XOR 26 is used in the feedback path of modified LFSR counter 20, the inputs of XOR 26 taken from the outputs of L4 and L5.

For the reset circuit 31, the output of latch 38 is used as one of the inputs to AND gate 35. Thus, reset may only happen if the latch output is HI. This allows for a reliable divide ratio of 2, which is achieved by providing all 0s as programmable input bits p0–p5, thus loading all 1s into latches L0–L5. The output of the divider circuit is then taken from MUX 58, which has the output of latch 38 as one of its inputs. Otherwise, as in FIG. 2, if all latch outputs are 1 (corresponding to a divide by 2 in FIG. 2), the output would always be HI.

FIG. 4 also includes output circuit 50, which allows for the divide by 1 ratio for the divider circuit. Output circuit 50 includes AND gates 52, 54, NAND gate 56, and MUX 58. As aforementioned, the output of the divider circuit is taken from the output of MUX 58. The output of latch 38 is applied to one of the inputs of MUX 58 and the inverted clock input CLK is applied to the other input of MUX 58. Programmable input pins p0–p5 are inputs to AND gates 52 and 54. The outputs of AND gates 52 and 54 are inputted into NAND gate 56. The output of NAND gate 56 is inputted into the select pin of MUX 58. The divide by 1 ratio is achieved by setting all programmable input bits p0–p5 to 1. Thus, for a divide by 1 ratio, the input clock CLK is directly fed through to the output through MUX 58. Again, the divider is self-resetting for handling the condition when the output of all the latches L0–L5 are 0.

Figure 5:
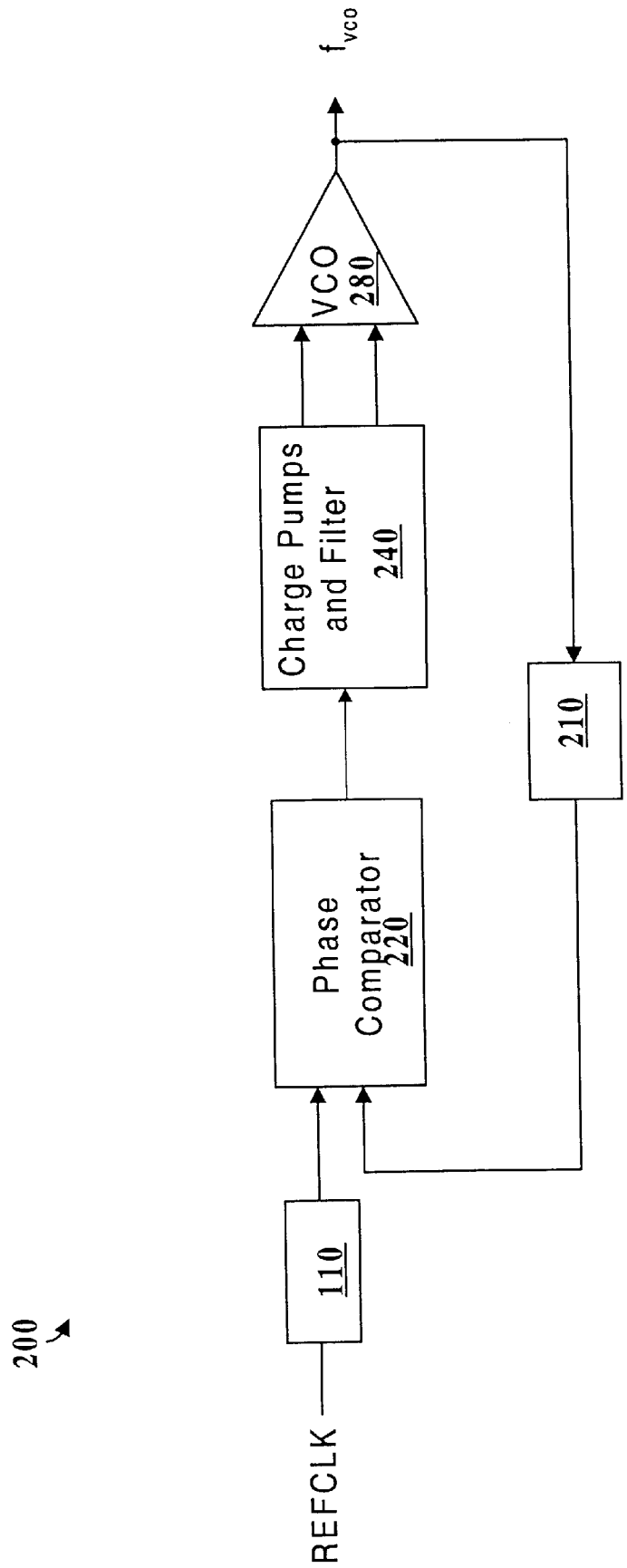
FIG. 5 is an exemplary circuit diagram of a PLL in accordance with another embodiment of the present invention.

As seen in FIG. 5, divider circuit 110 from FIG. 2 and divider circuit 210 from FIG. 4 may be used in an exemplary PLL circuit 200. In this example, PLL circuit 200 includes divider circuit 110 with a divide ratio in the range of 3 to 256, phase comparator 220, charge pumps and filter 240, voltage-controlled oscillator (VCO) 280, and divider circuit 210 with a divide ratio in the range of 1 to 64. A reference clock REFCLK is applied to divider circuit 110, which outputs a divided REFCLK signal to phase comparator 220. Divider circuit 210, which is used in the feedback loop of the PLL circuit, also outputs a divided frequency signal to phase comparator 220, the frequency signal being supplied by VCO 280. Phase comparator 220 compares the two outputs from divider circuit 110 and divider circuit 210 and outputs a signal to the charge pumps and filter 240, which then outputs signals to VCO 280. A signal with the frequency ($f_{VCO}$) of VCO 280 is then outputted.

Thus, the programmable, self-resetting divider according to the present invention provides a wide range of divide ratios for a substantially compact area. The divide ratios may also be inputted asynchronously. Also, because the divider is self-resetting, the divider provides stability and operability for any initial state.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A programmable divider comprising:
    a modified Linear Feedback Shift Register (LFSR) counter for starting in one of a plurality of initial states and for incrementing through a count range; and
    a reset circuit for detecting a pre-selected final state of the modified LFSR counter, for providing an output signal in response to said detecting, and for providing a reset signal to the modified LFSR counter in response to said detecting.

2. The programmable divider of claim 1 further comprising user selected programming bits for programming said one of a plurality of initial states.

3. The programmable divider of claim 2 further comprising:
    a self-initializing circuit for detecting an inoperative initial state of the modified LFSR counter and for providing a signal to the modified LFSR counter for shifting it into an operative initial state in response to said detecting the inoperative initial state.

4. The programmable divider of claim 1 further comprising means for adjusting the count range approximately between 3 and 256.

5. The programmable divider of claim 1 further comprising means for adjusting the count range approximately between 1 and 64.

6. The programmable divider of claim 1, wherein said reset circuit further comprises at least one AND gate and a latch.

7. The programmable circuit of claim 6, wherein said output of said latch is applied to an input of said AND gate.

8. The programmable divider of claim 1 further comprising means for adjusting the count range approximately between 1 and $2^n-1$, wherein n is an amount of latches in the modified LFSR counter.

9. The programmable divider of claim 2, wherein said modified LFSR is programmed asynchronously with said user selected programming bits.

10. A method for dividing an input clock signal comprising the steps of:
    a) programming a modified LFSR counter with one of a plurality of initial states;
    b) incrementing said modified LFSR counter through a count range;
    c) detecting a pre-selected final state of the modified LFSR counter;
    d) providing an output signal in response to said detecting, wherein said output signal is a ratio of said input clock signal; and
    e) providing a reset signal to said modified LFSR counter in response to said detecting.

11. The method of claim 10, wherein said programming step further comprises the step of: using user selected programming bits for programming said one of a plurality of initial states.

12. The method of claim 11, further comprising the steps of:
    f) detecting an inoperative initial state of the modified LFSR counter;
    g) providing a signal to the modified LFSR counter for shifting the modified LFSR counter into an operative initial state in response to detecting the inoperative initial state.

13. The method of claim 10, wherein said count range is adjusted between 3 and 256.

14. The method of claim 10, wherein said count range is adjusted between 1 and 64.

15. A Phase-Locked Loop (PLL) circuit having a programmable divider comprising:
    a modified Linear Feedback Shift Register (LFSR) counter for starting in one of a plurality of initial states and for incrementing through a count range;
    a reset circuit for detecting a pre-selected final state of the modified LFSR counter, for providing an output signal in response to said detecting, and for providing a reset signal to the modified LFSR counter in response to said detecting; and
    a phase comparator for receiving the output signal of the reset circuit.

16. The PLL circuit of claim 15 further comprising user selected programming bits for programming said one of a plurality of initial states.

17. The PLL circuit of claim 16 further comprising:
    a self-initializing circuit for detecting an inoperative initial state of the modified LFSR counter and for providing a signal to the modified LFSR counter for shifting it into an operative initial state in response to said detecting the inoperative initial state.

18. The PLL circuit of claim 15 further comprising means for adjusting the count range approximately between 3 and 256.

19. The PLL circuit of claim 15 further comprising means for adjusting the count range approximately between 1 and 64.

20. The PLL circuit of claim 15, further comprising means for adjusting the count range between 1 and $2^n-1$, wherein n is an amount of latches in the modified LFSR counter.

* * * * *